(12) United States Patent
Lei et al.

(10) Patent No.: US 12,322,736 B2
(45) Date of Patent: Jun. 3, 2025

(54) ARRAY SUBSTRATE AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Jie Lei, Beijing (CN); Zouming Xu, Beijing (CN); Jian Tian, Beijing (CN); Chunjian Liu, Beijing (CN); Xintao Wu, Beijing (CN); Jie Wang, Beijing (CN); Jianying Zhang, Beijing (CN); Yajun Ma, Beijing (CN); Zhi Zhang, Beijing (CN); Zhentao Li, Beijing (CN); Li Yin, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/765,387

(22) PCT Filed: May 31, 2021

(86) PCT No.: PCT/CN2021/097450
§ 371 (c)(1),
(2) Date: Mar. 30, 2022

(87) PCT Pub. No.: WO2022/252065
PCT Pub. Date: Dec. 8, 2022

(65) Prior Publication Data
US 2024/0113131 A1    Apr. 4, 2024

(51) Int. Cl.
*H01L 25/075*     (2006.01)
*H01L 25/16*      (2023.01)
(Continued)

(52) U.S. Cl.
CPC ........ *H01L 25/0753* (2013.01); *H01L 25/167* (2013.01); *H10D 86/441* (2025.01); *H10D 86/60* (2025.01)

(58) Field of Classification Search
CPC ... H01L 25/0753; H01L 25/167; H10D 86/60; H10D 86/441; H10K 59/40; H10K 59/122; H10K 59/131; H10K 59/873
(Continued)

(56) References Cited

U.S. PATENT DOCUMENTS

2020/0266214 A1   8/2020   Song et al.
2021/0126222 A1   4/2021   Liu et al.
(Continued)

FOREIGN PATENT DOCUMENTS

CN    108511625 A    9/2018
CN    110018597 A    7/2019
(Continued)

OTHER PUBLICATIONS

PCT/CN2021/097450 international search report.

*Primary Examiner* — Fazli Erdem
(74) *Attorney, Agent, or Firm* — IPro, PLLC

(57) ABSTRACT

An array substrate (100) and a display device. The array substrate (100) includes a bonding area (102). The array substrate (100) includes a substrate (10), a first conductive layer (20) on the substrate (10), a first insulating layer (30) on one side of the first conductive layer (20) away from the substrate (10), and a second conductive layer (40) on one side of the first insulating layer (30) away from the substrate (10). The bonding area (102) is provided with bonding pins (201), and the bonding pin (201) includes a first conductive portion (21) and a second conductive portion (41) located on the side of the first conductive portion (21) away from the substrate (10), the first conductive portion (21) is located in
(Continued)

the first conductive layer (20), the second conductive portion (41) is located in the second conductive layer (40), and the first conductive portion (21) is in direct contact with the second conductive portion (41). The first insulating layer (30) is provided with at least one first opening (301), and the orthographic projection of each of the first openings (301) on the substrate (10) covers the orthographic projections of the plurality of bonding pins (201) on the substrate (10).

18 Claims, 7 Drawing Sheets

(51) Int. Cl.
*H10D 86/40* (2025.01)
*H10D 86/60* (2025.01)

(58) Field of Classification Search
USPC .......................................................... 257/59
See application file for complete search history.

(56) References Cited

U.S. PATENT DOCUMENTS

2021/0193777 A1* 6/2021 Du ...................... H01L 27/1248
2022/0085076 A1 3/2022 Wang et al.

FOREIGN PATENT DOCUMENTS

| CN | 110970484 A | 4/2020 |
|---|---|---|
| CN | 212648246 U | 3/2021 |
| CN | 112768498 A | 5/2021 |

\* cited by examiner

ARRAY SUBSTRATE AND DISPLAY DEVICE

CROSS-REFERENCE TO RELATED APPLICATIONS

The present application is a U.S. National Phase of International Application No. PCT/CN2021/097450, entitled "ARRAY SUBSTRATE AND DISPLAY DEVICE", and filed on May 31, 2021. The entire contents of each of the above-listed applications are hereby incorporated by reference for all purposes.

TECHNICAL FIELD

The present disclosure relates to the field of display technologies, and in particular to an array substrate and a display device.

BACKGROUND

Mini-LED is a new type of LED display technology derived from small-pitch LEDs, also known as sub-millimeter light emitting diodes. Its grain size is about 50 um to 300 um, which is between a size of a traditional LED and a size of a Micro LED. Due to its excellent display effect, thin and light experience, high contrast ratio, long life and other advantages, it has an apparent application trend in the display field.

When an existing Mini-LED substrate is bonded to an FPC (Flexible Printed Circuit), the reliability of the bonding effect is low.

SUMMARY

The present disclosure provides an array substrate and a display device.

According to a first aspect of embodiments of the present disclosure, there is provided an array substrate. The array substrate includes: a bonding area;
  a substrate, a first conductive layer on the substrate, a first insulating layer on one side of the first conductive layer away from the substrate, and a second conductive layer on one side of the first insulating layer away from the substrate;
  wherein the bonding area is provided with bonding pins, the bonding pin includes a first conductive portion and a second conductive portion located on the side of the first conductive portion away from the substrate, the first conductive portion is located in the first conductive layer, the second conductive portion is located in the second conductive layer, and the first conductive portion is in direct contact with the second conductive portion;
  the first insulating layer is provided with at least one first opening, and an orthographic projection of each of the at least one first opening on the substrate covers orthographic projections of a plurality of the bonding pins on the substrate.

In one embodiment, the array substrate is further provided with a second insulating layer on the side of the second conductive layer away from the substrate, and the second insulating layer is provided a plurality of second openings, an edge of an orthographic projection of each of the second openings on the substrate is located inside an edge of one of the second conductive portions on the substrate.

In one embodiment, the array substrate further includes a light emitting area located on one side of the bonding area, and a gap exists between an edge of an orthographic projection of the first opening on the substrate close to the light emitting area and an edge of the orthographic projections of the bonding pins on the substrate close to the light emitting area.

In one embodiment, a part of the first insulating layer located in the bonding area includes a first organic layer.

In one embodiment, a part of the first insulating layer located in the bonding area further includes an inorganic film layer.

In one embodiment, the inorganic film layer includes a first inorganic layer on one side of the first organic layer away from the substrate, and the first opening includes a first sub-opening disposed in the first organic layer and a second sub-opening disposed in the first inorganic layer, and an edge of an orthographic projection of the second sub-opening on the substrate is located inside an edge of an orthographic projection of the first sub-opening on the substrate.

In one embodiment, the inorganic film layer further includes a second inorganic layer on the side of the first organic layer close to the substrate, and the first opening further includes a third sub-opening disposed on the second inorganic layer; an orthographic projection of the third sub-opening on the substrate coincides with an orthographic projection of the second sub-opening on the substrate.

In one embodiment, the second conductive portion covers one side part and a top part of the first conductive portion.

In one embodiment, the array substrate further includes a third inorganic layer located in the bonding area, the third inorganic layer is located between the first organic layer and the second conductive portion; the third inorganic layer is provided with a plurality of third openings, and an edge of an orthographic projection of each of the third openings on the substrate is located inside an edge of an orthographic projection of one of the first conductive portions on the substrate.

In one embodiment, the array substrate further includes a fourth inorganic layer located in the bonding area, the fourth inorganic layer is located between the first conductive portion and the substrates or between a first conductive structure and the first organic layer, the fourth inorganic layer is provided with a plurality of fourth openings; and an edge of an orthographic projection of each of the fourth openings on the substrate is located inside an edge of an orthographic projection of one of the first conductive portions on the substrate.

In one embodiment, the array substrate further includes a fifth inorganic layer located in the bonding area, and the fifth inorganic layer is located between the first conductive portion and the second conductive portions; the fifth inorganic layer is provided with a plurality of via holes, orthographic projections of the plurality of via holes on the substrate are located inside an orthographic projection of the first conductive portion on the substrate.

In one embodiment, a part of the second insulating layer located in the bonding area includes a sixth inorganic layer.

In one embodiment, the second insulating layer further includes a second organic layer, and a size of the second organic layer in the thickness direction of the substrate is smaller than or equal to a sum of sizes of the first conductive portion and the second conductive portion in the thickness direction of the substrate.

In one embodiment, the sixth inorganic layer is located on one side of the second organic layer close to the substrate; the second sub-opening includes a fourth sub-opening disposed in the six inorganic layer and a fifth sub-opening disposed in the second organic layer, an orthographic projection of the fifth sub-opening on the substrate covers an orthographic projection of the fourth sub-opening on the substrate.

In one embodiment, the orthographic projection of the fifth sub-opening on the substrate coincides with the orthographic projection of the fourth sub-opening on the substrate.

In one embodiment, the array substrate further includes a third organic layer located in the bonding area, the third organic layer is located on one side of the sixth inorganic layer away from the substrate, the third organic layer is provided with a fifth opening, and an orthographic projection of the fifth opening on the substrate covers the orthographic projections of the plurality of bonding pins on the substrate.

In one embodiment, the array substrate further includes a light emitting area located on one side of the bonding area, the first insulating layer includes a first organic layer located in the bonding area and a fourth organic layer located in the light emitting area, the first organic layer and the fourth organic layer are disposed in the same layer, the first organic layer has the same thickness as that of the fourth organic layer.

According to a second aspect of embodiments of the present disclosure, there is provided a display device, including the array substrate described above.

In the array substrate and the display device provided by the embodiments of the present application, since the orthographic projection of the first opening of the first insulating layer on the substrate covers the orthographic projections of the plurality of bonding pins on the substrate, there is no overlap between the first insulating layer and the bonding pins in the thickness direction of the substrate. Compared with the solution in which the first organic layer and the bonding pins overlap in the thickness direction of the substrate, it can reduce the offset of the film layer structure in the area where the bonding pins are located in the thickness direction of the substrate, and thus when the FPC is bonded to the bonding pins through the conductive particles of the conductive adhesive, the contact area between the conductive particles and the bonding pins will be increased, and the reliability of the bonding between the bonding pins and the FPC can be ensured.

DETAILED DESCRIPTION OF THE EMBODIMENTS

Exemplary embodiments will be described in detail herein examples of which are illustrated in the accompanying drawings. Where the following description refers to the drawings, the same numerals in different drawings refer to the same or similar elements unless otherwise indicated. The embodiments described in the following exemplary embodiments are not intended to represent all embodiments consistent with the present application. Rather, they are merely examples of devices and methods consistent with some aspects of the present application as recited in the appended claims.

The terms used in the present application are for the purpose of describing particular embodiments only, and are not intended to limit the present application. As used in the present application and the appended claims, singular forms "a," "the," and "the" are intended to include plural forms as well, unless the context clearly dictates otherwise. It will also be understood that the term "and/or" as used herein refers to and includes any and all possible combinations of one or more of the associated listed items.

It should be understood that although the terms first, second, third, etc. can be used in the present application to describe various information, such information should not be limited to these terms. These terms are only used to distinguish the same type of information from each other. For example, the first information can also be referred to as the second information, and similarly, the second information can also be referred to as the first information without departing from the scope of the present application. Depending on the context, the word "if" as used herein can be interpreted as "at the time of" or "when" or "in response to determining."

Embodiments of the present application provide an array substrate and a display device. The array substrate and the display device in the embodiments of the present application will be described in detail below with reference to the accompanying drawings. The features of the embodiments described below can complement each other or be combined with each other without conflict.

Figure 1:
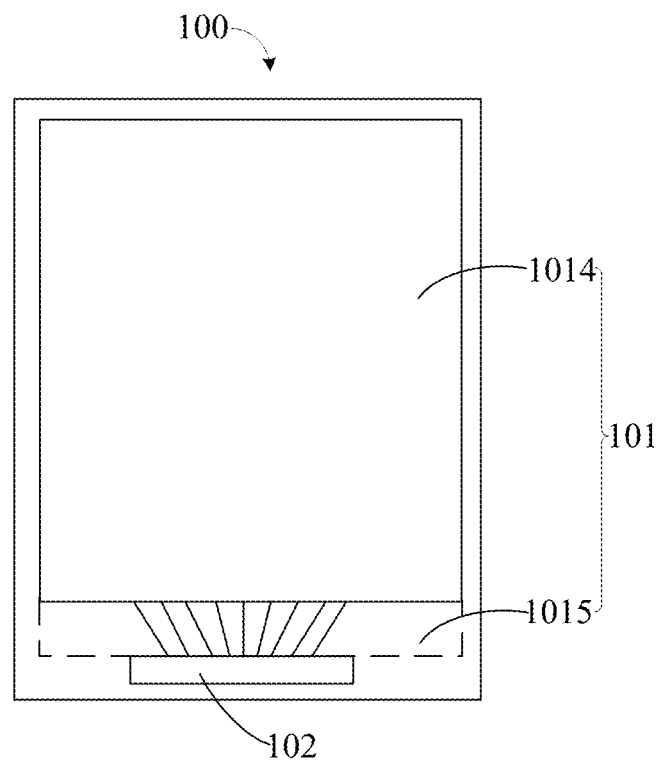
FIG. 1 is a top view of an array substrate provided by an exemplary embodiment of the present application.

An embodiment of the present application provides an array substrate. Referring to FIG. 1, the array substrate 100 includes a light emitting area 101 and a bonding area 102. The bonding area 102 is disposed on one side of the light emitting area 101, and the bonding area 102 is provided with bonding pins for bonding with an FPC. A driving chip for driving the array substrate is electrically connected with the FPC. The light emitting area 101 is provided with a plurality of light emitting diodes.

The array substrate provided in the embodiment of the present application can be used as a display substrate, and can also be further applied to a display device as a backlight unit. When the array substrate is used as a backlight unit, the light emitting area can be provided with a plurality of light emitting sub-areas, each of the light emitting sub-areas is provided with a plurality of light emitting diodes, the plurality of light emitting diodes in each of the light emitting sub-areas can be connected in series, and the array substrate can be controlled per sub-area. When the array substrate is used as a display substrate, each of the light emitting diodes is used as a sub-pixel.

Figure 2:
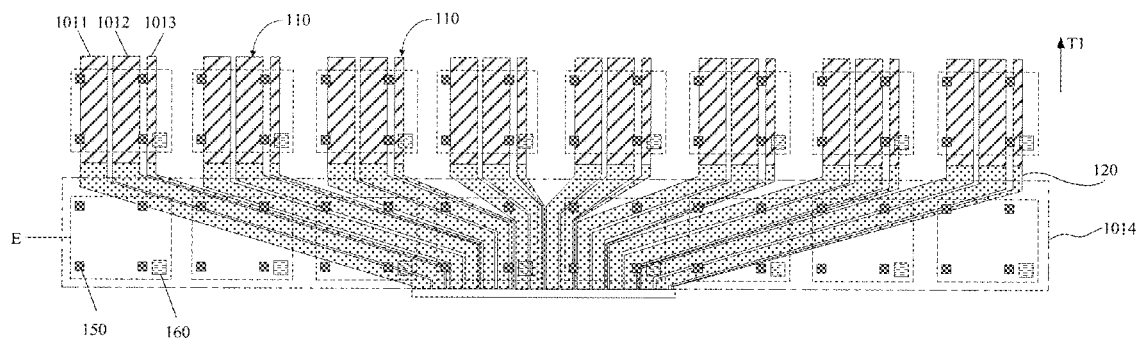
FIG. 2 is a schematic diagram of a partial structure of an array substrate provided by an exemplary embodiment of the present application.

In one embodiment, as shown in FIGS. 1 and 2, the light emitting area 101 includes a main light emitting sub-area 1014 and a fan-out sub-area 1015, and the fan-out sub-area 1015 is located between the main light emitting sub-area 1014 and the bonding area 102. The fan-out sub-area can be provided with light emitting diodes; or, the fan-out sub-area can be provided with no light emitting diode.

The array substrate 100 includes a substrate, a first conductive layer on the substrate, a first insulating layer on the first conductive layer, and a second conductive layer on the first insulating layer. The first conductive layer located in the light emitting area is generally used for arranging various signal lines. Optionally, the thickness of the first conductive layer is in the range of 1.5-7 um, and its material includes copper. For example, a laminate material such as MoNb/Cu/MoNb can be formed by sputtering. The bottom layer MoNb is used to improve adhesion. The middle layer Cu is used to transmit electrical signals, and the top layer MoNb is used to prevent oxidation. The first conductive layer can also be formed by electroplating. A seed layer MoNiTi is first formed to improve the nucleation density of crystal grains, and then the anti-oxidation layer MoNiTi is formed after electroplating.

The second conductive layer located in the light emitting area can be provided with lead wires for connecting, for example, wires for connecting a plurality of light emitting devices in the same light emitting unit in series. Optionally, the thickness of the second conductive layer is about 6000 Å, and its material can be, for example, a laminate of MoNb/Cu/CuNi, the bottom layer MoNb is used to improve adhesion, the middle layer Cu is used to transmit electrical signals, and the top layer CuNi can be used for both anti-oxidation and solid crystal fastness.

In some embodiments, as shown in FIG. 2, the fan-out sub-area 1015 is provided with a plurality of connecting lines 120, and each of the connecting lines 120 electrically connects a signal line 110 to the FPC bonded in the bonding area. The plurality of signal lines 110 in the light emitting area include a plurality of power signal lines 1011, a plurality of ground lines 1012, a plurality of power supply lines 1013 and a plurality of address signal lines (not shown in the figure). The power signal lines 1011 and the ground lines 1012 are used to supply power to the light emitting diodes 150. The power supply lines 1013 are used to provide electrical signals to the driving chips 160. Light emitting sub-areas E located in the same column are connected to the same power signal line 1011, that is, a power signal line 1011 can provide power to light emitting diodes in a column of light emitting sub-areas E. Light emitting sub-areas E located in the same column are connected to the same ground line 1012, that is, a ground line 1012 can be electrically connected to driving chips in a column of light emitting sub-areas E. The driving chips located in the same column of light emitting sub-areas E are electrically connected to the same power supply line 1013, so as to provide electrical signals to the driving chips in a column of light emitting sub-areas E. Every two columns of light emitting sub-areas E correspond to one addressing signal line, and the connection modes can be different depending on different driving logics of the respective driving chips.

The first insulating layer is located between the first conductive layer and the second conductive layer, which insulates the first conductive layer from the second conductive layer, and can ensure that a capacitance between the wire and the driving voltage line meets requirements. Other insulating layers can also be disposed between the first conductive layer and the second conductive layer.

Figure 3:
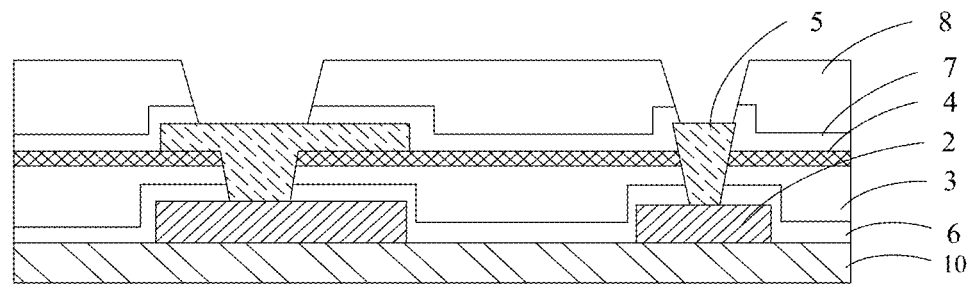
FIG. 3 is a partial cross-sectional view of a light emitting area of an array substrate provided by an exemplary embodiment of the present application.

As shown in FIG. 3, a part of the array substrate located in the light emitting area includes a first conductive structure 2 on the substrate 10, a first inorganic film layer 6 on the side of the first conductive structure 2 away from the substrate, a first organic film layer 3 located on the side of the first inorganic film layer 6 away from the substrate, a second inorganic film layer 4 located on the side of the first organic film layer 3 away from the substrate, a second conductive structure 5 located on the side of the second inorganic film layer 4 away from the substrate, a third inorganic film layer 7 located on the side of the second conductive structure away from the substrate, and a second organic film layer 8 on the side of the third inorganic film layer 7 away from the substrate. Wherein the second conductive structure 5 is electrically connected to the first conductive structure 2 through openings penetrating the first inorganic film layer 6, the first organic film layer 3 and the second inorganic film layer 4. The third inorganic film layer 7 and the second organic film layer 8 are provided with openings exposing part of the second conductive structure 5. The first conductive structure 2 is located in the first conductive layer, and the second conductive structure 5 is located in the first conductive layer. That the first conductive structure 2 is located in the first conductive layer refers to that the first conductive structure 2 is a part of the first conductive layer; and that the second conductive structure 5 is located in the second conductive layer refers to that the second conductive structure 5 is a part of the second conductive layer.

In another embodiment, the first inorganic film layer 6 can be located between the substrate 10 and the first conductive structure 2.

In one embodiment, each insulating layer in the light emitting area can be a single-layer film layer, or can include a plurality of film sub-layers. When each insulating layer in the light emitting area includes a plurality of film sub-layers, the thickness of the insulating layer can be made larger.

As shown in FIG. 4 to FIG. 10, the first conductive layer 20 and the second conductive layer 40 are located on the substrate 10. The bonding area 102 is provided with bonding pins 201, the bonding pin includes a first conductive portion 21 and a second conductive portion 41 located on the side of the first conductive portion 21 away from the substrate 10. The conductive portion 21 is located in the first conductive layer 20, and the second conductive portion 41 is located in the second conductive layer 40. Wherein that the first conductive portion 21 is located in the first conductive layer 20 refers to that the first conductive portion 21 is a part of the first conductive layer 20; and that the second conductive portion 41 is located in the second conductive layer 40 refers to that the second conductive portion 41 is a part of the second conductive layer 40. The second conductive portion 41 is in direct contact with the first conductive portion 21 of the same bonding pin 201.

The inventor found that due to the existence of some insulating layers between the first conductive layer 20 and the second conductive layer 40, when the insulating layer and the bonding pin have an overlapping area in the thickness direction of the substrate, there will be a large offset of the film layer structure in the area where the bonding pins are located in the thickness direction of the substrate (a difference between a maximum distance from the surface of the layer structure facing away from the substrate to the substrate and a minimum distance from the surface of the bonding pin facing away from the substrate to the substrate), and thus when the FPC is bonded to the bonding pins through the conductive particles of the conductive adhesive, the contact area between the conductive particles and the bonding pins will be affected, and the reliability of the bonding between the bonding pins and the FPC will be affected.

In the embodiment of the present application, as shown in FIG. 4 to FIG. 10, the first insulating layer 30 is provided with a first opening 301, and an orthographic projection of the first opening 301 on the substrate 10 covers orthographic projections of the plurality of bonding pins 201 on the substrate 10. Wherein that the orthographic projection of the first opening 301 on the substrate 10 covers the orthographic projections of the bonding pins 201 on the substrate 10 refers to that the outermost edge of the orthographic projections of the plurality of bonding pins 201 on the substrate 10 coincides with the edge of the orthographic projection of the first opening on the substrate 10, or the outermost edge of the orthographic projections of the plurality of bonding pins 201 on the substrate 10 are located inside of the edge of the orthographic projection of the first opening 301 on the substrate 10. In the array substrate provided by the embodiment of the present application, since the orthographic projection of the first opening 301 of the first insulating layer 30 on the substrate 10 covers the orthographic projections of the bonding pins 201 on the substrate 10, the first insulating layer 30 and the bonding pins 201 do not overlap in the thickness direction of the substrate, which can reduce the offset of the film layer structure in the area where the bonding pins are located in the thickness direction of the substrate, and thus when the FPC is bonded to the bonding pins through the conductive particles of the conductive adhesive, the contact area between the conductive particles and the bonding pins will be increased, and the reliability of the bonding between the bonding pins and the FPC can be ensured.

In one embodiment, the first insulating layer is provided with a plurality of first openings, and the orthographic projection of each of the first openings on the substrate covers the orthographic projections of the plurality of bonding pins on the substrate, the number of the FPCs bonded in the bonding area is the same as the number of the first openings, and each of the FPCs is bonded to the bonding pins corresponding to one first opening. In another embodiment, the first insulating layer is provided with one first opening, and the orthographic projection of the first opening on the substrate respectively covers the orthographic projections of the bonding pins on the substrate, and the bonding area can be bonded with one FPC. In the embodiment of the present application, the second conductive portion 41 of the bonding pin 201 is located on the side of the first conductive portion 21 away from the substrate. During the process of etching the part of the second conductive layer located in the light emitting area, the second conductive portion 41 can protect the first conductive portion 21.

In the embodiment of the present application, the bonding pin 201 includes the first conductive portion 21 and the second conductive portion 41. Compared with the solution in which the bonding pin 201 only includes the second conductive portion, it is possible to avoid the problem that due to the small thickness of the second conductive portion, the resistance of the bonding pin 201 does not meet the requirements.

In one embodiment, there is a gap between an edge of the orthographic projection of the first opening 301 on the substrate 10 close to the light emitting area 101 and an edge of the orthographic projections of the bonding pins 201 on the substrate 10 close to the light emitting area 101. In the process of bonding the FPC and the bonding pins, it is necessary to press the FPC with an indenter, and with the gap between the edge of the orthographic projection of the first opening 301 on the substrate 10 close to the light emitting area 101 and the edge of the orthographic projections of the bonding pins 201 on the substrate 10 close to the light emitting area 101, it is desirable to prevent the indenter from pressing on the first insulating layer 30 and decreasing the force of the indenter on the FPC, thereby affecting the bonding effect of the FPC and the bonding pins. Thus, it can improve the reliability of the bonding between the bonding pins and the FPC.

In some embodiments, the gap between the edge of the orthographic projection of the first opening 301 on the substrate 10 close to the light emitting area 101 and the edge of the orthographic projections of the bonding pins 201 on the substrate 10 close to the light emitting area 101 can be greater than or equal to 0.5 mm, for example, can be 0.5 mm, 0.7 mm, 0.9 mm, 1.0 mm, and the like.

In some implementations, the side wall of the first opening 301 are continuous, and the side walls of the first opening 301 are enclosed to form a closed ring. The first opening 301 can be a square hole or a circle hole, or an irregularly shaped hole. The shape of the ring formed by the side wall of the first opening 301 is the same as the shape of the hole. In other embodiments, the sidewall of the first opening 301 can be discontinuous, for example, the sidewall of the first opening 301 away from the light emitting area has a gap.

In one embodiment, as shown in FIGS. 4 to 10, the portion of the first insulating layer 30 located in the bonding area 102 includes a first organic layer 31.

Further, the thickness of the first organic layer 31 ranges from 2 um to 4 um. This arrangement can not only facilitate implementation of the production process, but also avoid an excessively large thickness of the first organic layer 31 and resulting in a large thickness of the array substrate. In some embodiments, the thickness of the first organic layer 31 is, for example, 2 um, 2.5 um, 3 um, 3.5 um, 4 um, and the like.

In one embodiment, the first organic layer 31 is a single-layer film layer, or the first organic layer 31 includes a plurality of organic sub-layers, that is, the first organic layer 31 is formed by multiple coating processes. In some embodiments, the bonding area can be provided with no first organic layer.

In one embodiment, the portion of the first insulating layer located in the light emitting area includes a fourth organic layer, and the thickness of the fourth organic layer is the same as that of the first organic layer 31. In this way, the fourth organic layer and the first organic layer can be formed with the same mask. In some embodiments, the fourth organic layer is the first organic film layer. In other implementations, the first organic film layer includes a plurality of organic sub-layers, and the fourth organic layer is part of the sub-layers of the first organic film layer. In one implementation, the portion of the first insulating layer 30 located in the bonding area 102 further includes an inorganic film layer. The inorganic film layer of the first insulating layer 30 helps to block water vapor, to reduce the amount of water vapor intruding into the bonding pins, and to help to improve the reliability of the array substrate.

Figure 4:
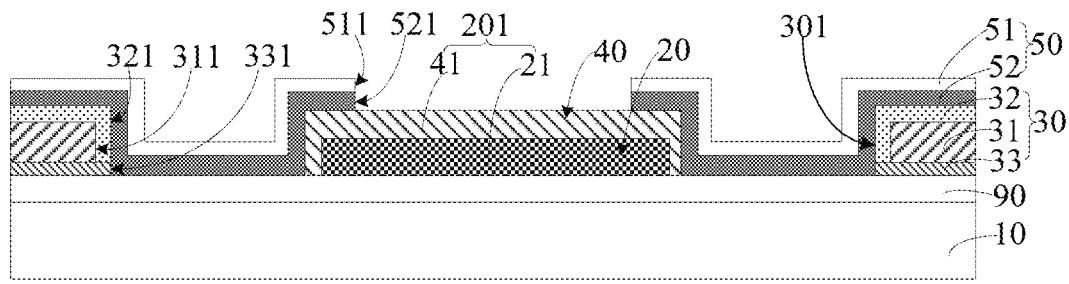
FIG. 4 is a partial cross-sectional view of a bonding area of an array substrate provided by an exemplary embodiment of the present application.
Figure 5:
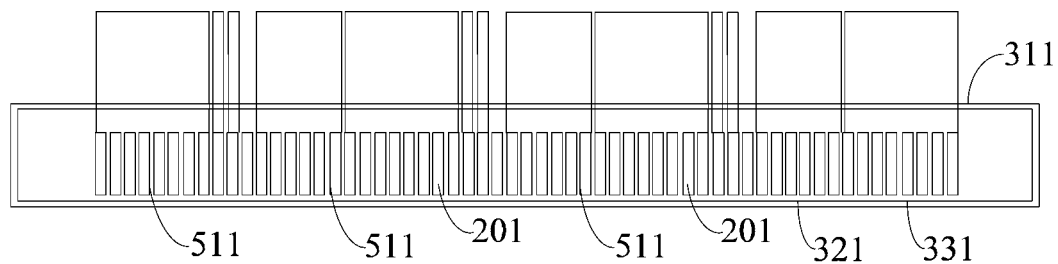
FIG. 5 is a schematic diagram of a partial structure of the array substrate shown in FIG. 4.
Figure 6:
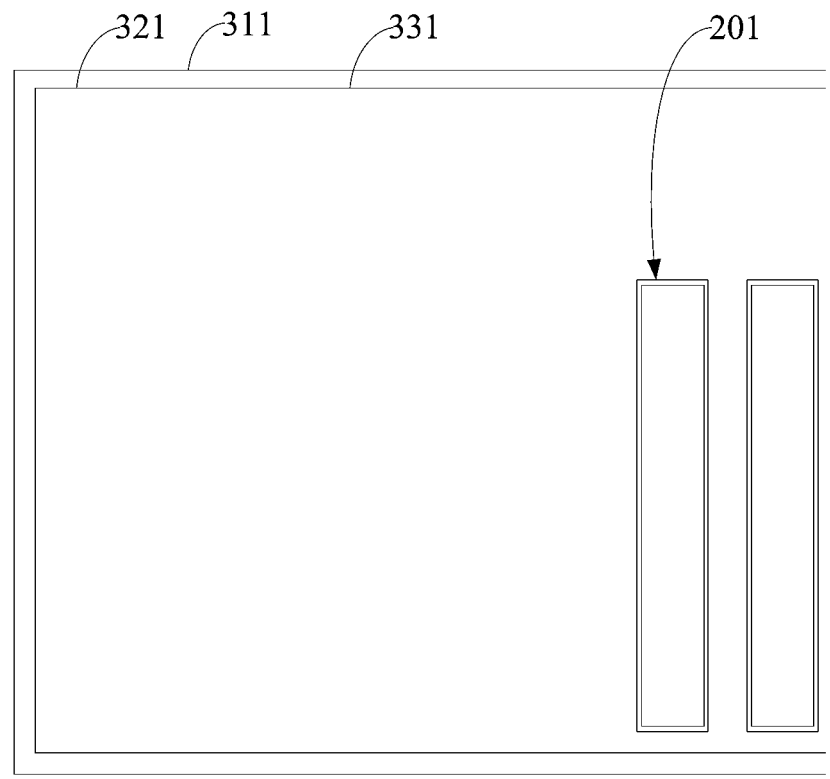
FIG. 6 is a schematic diagram of a partial structure of the array substrate shown in FIG. 4.

Further, as shown in FIG. 4, the inorganic film layer includes a first inorganic layer 32 located on the side of the first organic layer 31 away from the substrate 10, and the first opening includes a first sub-opening 311 disposed in the first organic layer 31 and a second sub-opening 321 disposed in the first inorganic layer 32. An edge of the orthographic projection of the second sub-opening 321 on the substrate 10 is located inside the edge of the orthographic projection of the first sub-opening 311 on the substrate. In this way, the first inorganic layer 32 covers the side surface of the first sub-opening 311 of the first organic layer 31, which can further improve the reliability of the array substrate.

In some embodiments, the first inorganic layer 32 can be a single-layer film layer, or the first inorganic layer includes a plurality of inorganic sub-layers and is formed through multiple coating processes. In some embodiments, the first inorganic layer 32 and the second inorganic film layer located in the light emitting area are different parts of the same film layer.

Further, as shown in FIG. 4, the inorganic film layer further includes a second inorganic layer 33 located on the side of the first organic layer 31 close to the substrate 10. The first opening 301 also includes a third sub-opening 331 disposed on the second inorganic layer 33. The orthographic projection of the third sub-openings 331 on the substrate 10 coincides with the orthographic projection of the second sub-opening 321 on the substrate 10. That is, the shape, area and position of the second sub-opening 321 provided on the first inorganic layer 32 and the shape, area and position of the third sub-opening 331 provided on the second inorganic layer 33 are the same. In this way, the first inorganic layer 32 and the second inorganic layer 33 can be fabricated with the same mask, which helps to reduce the fabrication cost of the array substrate.

In some embodiments, the second inorganic layer 33 can be a single-layer film layer, or the second inorganic layer 33 includes a plurality of inorganic sub-layers and is formed through multiple coating processes. In some embodiments, the second inorganic layer 33 and the first inorganic film layer located in the light emitting area are different parts of the same film layer.

In one embodiment, a gap between the edge of the orthographic projection of the first sub-opening 311 on the substrate and the edge of the orthographic projection of the second sub-opening 321 on the substrate can be about 50 um.

In one embodiment, the thickness of the first inorganic layer 32 ranges from 1500 angstroms to 3500 angstroms. In this way, it can avoid an excessively small thickness of the first inorganic layer 32 and resulting in greater difficulty in the process, and can avoid an excessively large thickness of the first inorganic layer 32 and resulting in an increase in the thickness of the array substrate. In some embodiments, the thickness of the first inorganic layer 32 is, for example, 1500 angstroms, 2000 angstroms, 2500 angstroms, 3000 angstroms, 3500 angstroms, and the like.

In one embodiment, the thickness of the second inorganic layer 33 ranges from 1500 angstroms to 3500 angstroms. In this way, the thickness of the second inorganic layer 33 can be prevented from being too small, which leads to greater difficulty in the process, and the thickness of the second inorganic layer 33 can be prevented from being too large, resulting in an increase in the thickness of the array substrate. In some embodiments, the thickness of the second inorganic layer 33 is, for example, 1500 angstroms, 2000 angstroms, 2500 angstroms, 3000 angstroms, 3500 angstroms, and the like.

In one embodiment, the second conductive portion 41 covers the side part and the top part of the first conductive portion 21. The top part of the first conductive portion 21 refers to the surface of the first conductive portion 21 away from the substrate 10, and the side part of the first conductive portion 21 refers to the surface of the first conductive portion 21 facing the first opening.

In this way, the second conductive portion 41 can protect the first conductive portion 21, and when the second conductive portion 41 is etched, the first conductive portion 21 will not be etched. In this embodiment, the process of forming the second conductive portion can be as follows.

First, a conductive material layer is formed on the first conductive portion 21 by a sputtering process, the conductive layer covers the top and side parts of the first conductive portion, and the orthographic projection of the conductive material layer on the substrate covers the substrate.

Subsequently, the conductive material layer is etched to form a second conductive portion.

In this embodiment, the first conductive portion 21 can include a single-layer conductive film layer, and the material of the first conductive portion 21 can be copper; or the first conductive portion 21 can include a first conductive film layer and a second conductive film layer, and the second conductive film layer covers the side and top parts of the first conductive film layer, the material of the first conductive film layer can be copper, and the second conductive film layer can be a laminated structure, such as a laminated structure of MoNb/Cu/MoNb. Both the first conductive film layer and the second conductive film layer can be formed by a magnetron sputtering process. The material of the second conductive portion 41 can be a laminated structure, including two protective film layers and a copper film layer between the two protective film layers, for example, the second conductive portion 41 is a laminated structure of MoNb/Cu/MoNb.

In other embodiments, the second conductive portion 41 can be formed on the top part of the first conductive portion 21, and the second conductive portion 41 does not cover the side part of the first conductive portion 21. In this embodiment, the second conductive portion 41 can be formed by an electroplating process.

Figure 7:
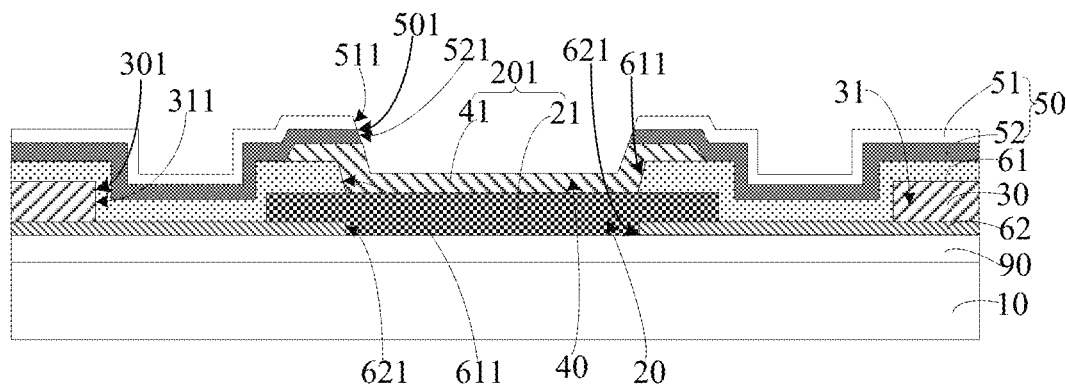
FIG. 7 is a partial cross-sectional view of a bonding area of an array substrate provided by another exemplary embodiment of the present application.

In another embodiment, as shown in FIG. 7, the part of the first insulating layer located in the bonding area includes a first organic layer 31. The array substrate 100 also includes a third inorganic layer 61 located in the bonding area. The third inorganic layer 61 is located between the first organic layer 31 and the second conductive portion 41. The third inorganic layer 61 is provided with a plurality of third openings 611, and the edge of the orthographic projection of each of the third openings 611 on the substrate 10 is located inside the edge of the orthographic projection of one of the first conductive portions 21 on the substrate 10. The third openings 611 can correspond to the bonding pins 201 one to one, and the edge of the orthographic projection of the third openings 611 on the substrate 10 is located inside the edge of the orthographic projection of the corresponding first conductive portion 21 of the bonding pin 201 on the substrate 10. In this way, the third inorganic layer 61 covers the edge of the first conductive portion 21, which helps to prevent water and oxygen from invading the first conductive portion 21, which can further improve the reliability of the array substrate. Moreover, since the thickness of the third inorganic layer 61 is relatively small, it will not affect the reliability of the bonding between the bonding pins and FPC bonding. The edge of the orthographic projection of each of the third openings 611 on the substrate 10 can also be located inside the edge of the orthographic projection of the second conductive portion 41 on the substrate 10.

In some embodiments, the third inorganic layer 61 can be a single-layer film layer, or the third inorganic layer 61 includes a plurality of inorganic sub-layers and is formed through multiple coating processes. In some embodiments, the third inorganic layer 61 and the second inorganic film layer located in the light emitting area are different parts of the same film layer.

In one embodiment, the thickness of the third inorganic layer 61 ranges from 1500 angstroms to 3500 angstroms. In this way, it can avoid an excessively small thickness of the third inorganic layer 61 and resulting in greater difficulty in the process, and can avoid an excessively large thickness of the third inorganic layer 61 and resulting in an increase in the thickness of the array substrate and the increased offset of the film layer structure in the area where the bonding pins are located in the thickness direction of the substrate, which affects the reliability of the bonding pin and the FPC. In some embodiments, the thickness of the third inorganic layer 61 is, for example, 1500 angstroms, 2000 angstroms, 2500 angstroms, 3000 angstroms, 3500 angstroms, and the like.

Figure 8:
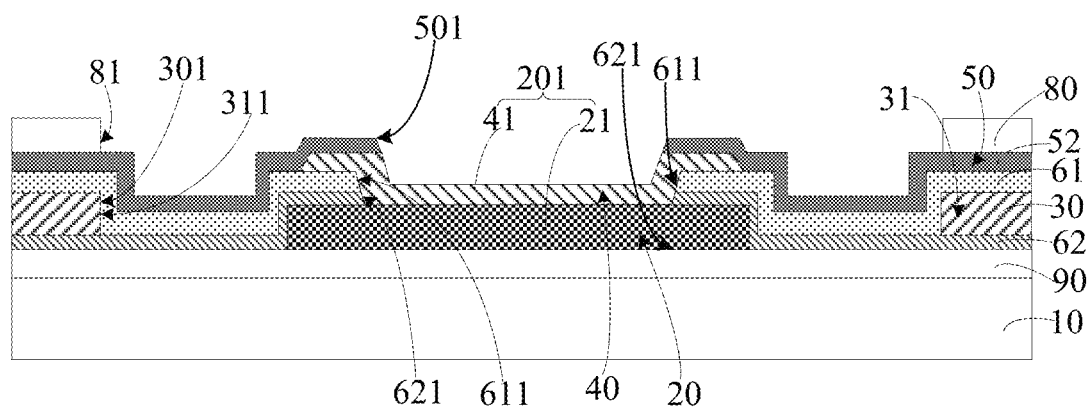
FIG. 8 is a partial cross-sectional view of a bonding area of an array substrate provided by yet another exemplary embodiment of the present application.
Figure 9:
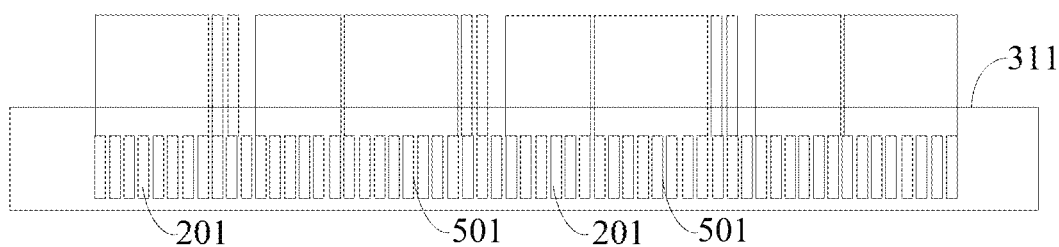
FIG. 9 is a schematic diagram of a partial structure of the array substrate shown in FIG. 7.
Figure 10:
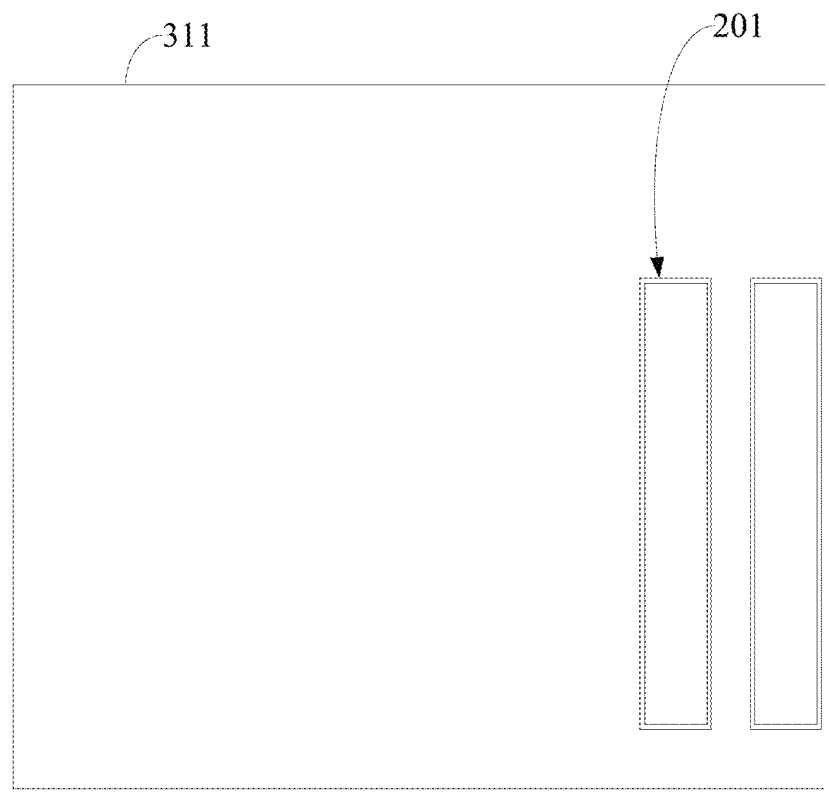
FIG. 10 is a schematic diagram of a partial structure of the array substrate shown in FIG. 7.

In one embodiment, the array substrate 100 further includes a fourth inorganic layer located in the bonding area. As shown in FIG. 7, the fourth inorganic layer 62 is located between the first conductive portion 21 and the substrate 10; or, as shown in FIG. 8, the fourth inorganic layer 62 is located between the first conductive portion 21 and the first organic layers 31. The fourth inorganic layer 62 is provided with a plurality of fourth openings 621; the edge of the orthographic projection of each of the fourth openings 621 on the substrate 10 is located inside the edge of the orthographic projection of one of the first conductive portions 21 on the substrate 10. The fourth openings 621 can correspond to the bonding pins 201 one to one, and the edge of the orthographic projection of the fourth opening 621 on the substrate 10 is located inside the edge of the orthographic projection of the corresponding first conductive portion 21 of the bonding pin 201 on the substrate 10. The fourth inorganic layer 62 helps prevent water and oxygen from invading the first conductive portion 21 and improves the reliability of the array substrate. Moreover, since the thickness of the fourth inorganic layer 62 is relatively small, it will not affect the reliability of the bonding between the bonding pins and FPC bonding. The edge of the orthographic projection of each of the fourth openings 621 on the substrate 10 can also be located inside the edge of the orthographic projection of the second conductive portion 41 on the substrate 10.

In one embodiment, the thickness of the fourth inorganic layer 62 ranges from 1500 angstroms to 3500 angstroms. In this way, it can avoid an excessively small thickness of the fourth inorganic layer 62 and resulting in greater difficulty in the process, and can avoid an excessively large thickness of the fourth inorganic layer 62 and resulting in an increase in the thickness of the array substrate and the increased offset of the film layer structure in the area where the bonding pins are located in the thickness direction of the substrate, which affects the reliability of the bonding pin and the FPC. In some embodiments, the thickness of the fourth inorganic layer 62 is, for example, 1500 angstroms, 2000 angstroms, 2500 angstroms, 3000 angstroms, 3500 angstroms, and the like.

In some embodiments, the fourth inorganic layer 62 can be a single-layer film layer, or the fourth inorganic layer 62 includes a plurality of inorganic sub-layers and is formed through multiple coating processes. In some embodiments, when the first inorganic film layer located in the light emitting area is located between the substrate 10 and the first conductive structure, and the fourth inorganic layer 62 is located between the first conductive portion 21 and the substrate 10, the fourth inorganic layer 62 and the first inorganic film layer are different parts of the same film layer. When the first inorganic film layer located in the light emitting area is located between the first organic film layer and the first conductive structure, and the fourth inorganic film layer 62 is located between the first conductive portion and the first organic layer 31, the fourth inorganic layer 62 and the first inorganic film layer are different parts of the same film layer.

Figure 11:
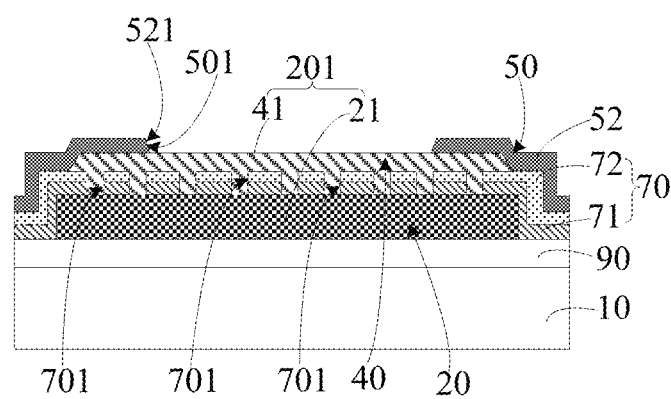
FIG. 11 is a partial cross-sectional view of a bonding area of an array substrate provided by yet another exemplary embodiment of the present application.
Figure 12:
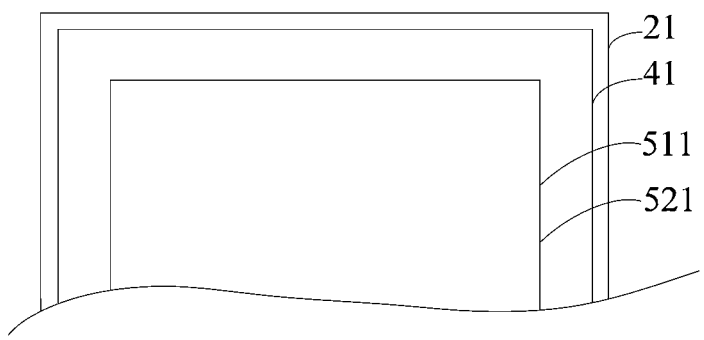
FIG. 12 is a schematic diagram of a partial structure of the array substrate shown in FIG. 4.
Figure 13:
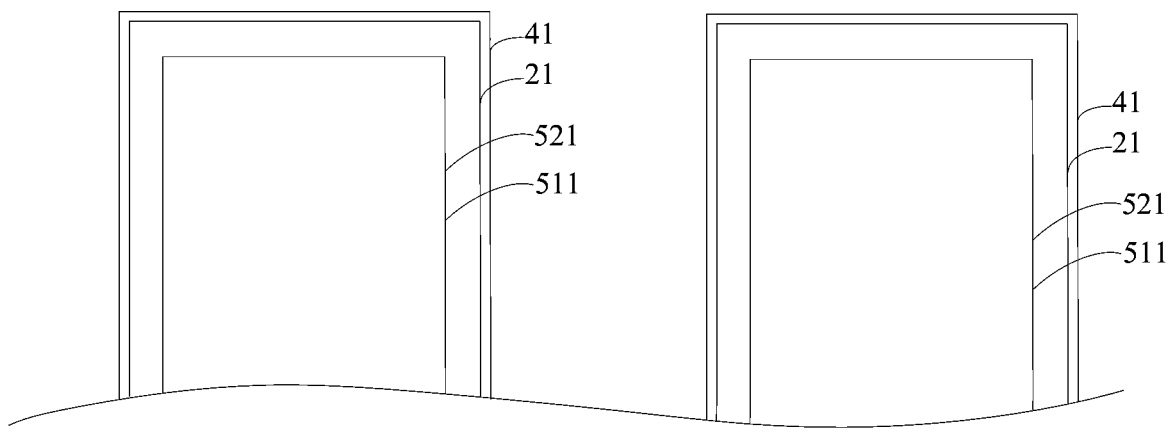
FIG. 13 is a schematic diagram of a partial structure of the array substrate shown in FIG. 4.
Figure 14:
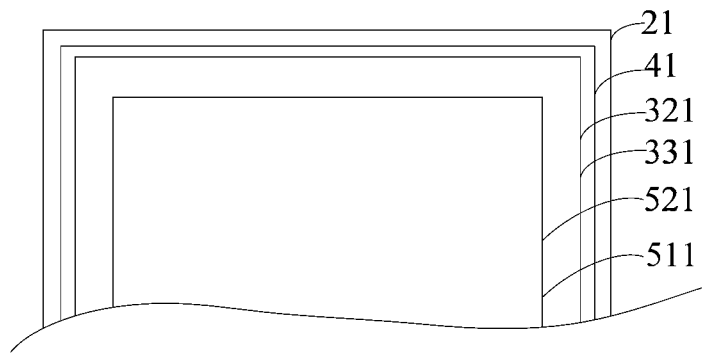
FIG. 14 is a schematic diagram of a partial structure of the array substrate shown in FIG. 7.
Figure 15:
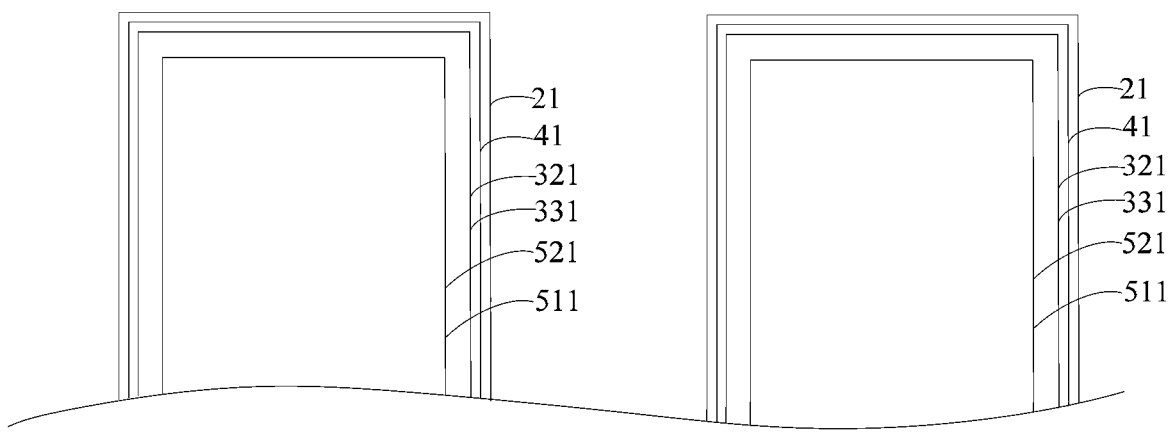
FIG. 15 is a schematic diagram of a partial structure of the array substrate shown in FIG. 7.

In one embodiment, the part of the first insulating layer located in the bonding area includes a first inorganic layer. Referring to FIG. 11, the display substrate 100 further includes a fifth inorganic layer 70 located in the bonding area. The fifth inorganic layer 70 is located between the first conductive portion 21 and the second conductive portion 41. The fifth inorganic layer 70 is provided with a plurality of via holes 701, and the orthographic projection of the plurality of via holes 701 on the substrate 10 is located inside the orthographic projection of the first conductive portion 21 on the substrate 10. The second conductive portion 41 is connected to the first conductive portion 21 through the plurality of via holes 701. The surface of the second conductive portion 41 facing the substrate 10 has a concave-convex structure. This arrangement helps to improve the adhesion between the second conductive portion 41 and the fifth inorganic layer 70, so that the second conductive portion 41 and the fifth inorganic layer 70 are not easy to fall off. In addition, each of the second conductive portions 41 is conducted with the first conductive portion 21 through the plurality of via holes 701, so that even if a via hole corresponding to a part of the second conductive portion 41 is damaged, the second conductive portion 41 can still communicate with the first conductive portion 21 through other via holes. The yield of the connection between the second conductive portion 41 and the first conductive portion 21 can be improved. In some embodiments, the sizes of the plurality of via holes 701 in the fifth inorganic layer 70 can be the same or different from one another.

In some embodiments, the fifth inorganic layer 70 can be a single-layer film layer, or the fifth inorganic layer 70 includes a plurality of inorganic sub-layers and is formed by multiple coating processes. As shown in FIG. 11, the fifth inorganic layer 70 can include a first inorganic sub-layer 71 and a second inorganic sub-layer 72 on one side of the first inorganic sub-layer 71 away from the substrate.

In some embodiments, when the first inorganic film layer in the light-emitting area is located between the substrate 10 and the first conductive structure, the fifth inorganic layer 70 and the second inorganic film layer in the light-emitting area are different parts of the same film layer. In another embodiment, when the first inorganic film layer located in the light emitting area is located between the first organic film layer and the first conductive structure, the fifth inorganic layer 70 and the first inorganic film layer or the second inorganic film layer located in the light emitting area are different parts of the same film layer. In yet another embodiment, the first inorganic film layer located in the light emitting area is located between the first organic film layer and the first conductive structure, and when the fifth inorganic layer 70 includes a first inorganic sub-layer 71 and a second inorganic sub-layer 72, the first inorganic sub-layer 71 and the first inorganic film layer are different parts of the same film layer, and the second inorganic sub-layer 72 and the second inorganic film layer are different parts of the same film layer.

In one embodiment, referring to FIG. 4, FIG. 7, FIG. 8 and FIG. 11, the array substrate 100 is further provided with a second insulating layer 50 on the side of the second conductive layer 40 away from the substrate 10, so the second insulating layer 50 is provided with a plurality of second openings. Referring to FIGS. 8, 11 to 15, the edge of the orthographic projection of each of the second openings 501 on the substrate 10 is located inside the edge of the orthographic projection of one of the second conductive portions 41 on the substrate 10. The second openings 501 correspond to the bonding pins 201 one to one, and the edge of the orthographic projection of the second opening 501 on the substrate 10 is located inside the edge of the orthographic projection of the corresponding second conductive portion 41 of the bonding pin 201 on the substrate 10.

In one embodiment, the part of the second insulating layer 50 located in the bonding area includes a sixth inorganic layer 52. The sixth inorganic layer 52 can slow down the intrusion rate of water and oxygen into the second conductive portion 41, thereby improving the reliability of the array substrate.

In some embodiments, the sixth inorganic layer 52 can be a single-layer film layer, or the sixth inorganic layer 52 includes a plurality of inorganic sub-layers and is formed by multiple coating processes. In some embodiments, the sixth inorganic layer 52 and the third inorganic film layer located in the light emitting area are different parts of the same film layer.

In one embodiment, referring to FIG. 7, the second insulating layer 50 further includes a second organic layer 51, and the size of the second organic layer 51 in the thickness direction of the substrate 10 is less than or equal to the sum of the sizes of the first conductive portion 21 and the second conductive portion 41 in the thickness direction of the substrate 10. This arrangement can prevent the bonding pin from being recessed relative to the surrounding film structure, which helps to improve the reliability of the bonding between the bonding pins and the FPC.

In some embodiments, the second organic layer 51 can be a single-layer film layer, or the second organic layer 51 includes a plurality of sub-organic layers and is formed by multiple coating processes. In some embodiments, the second organic layer 51 and the second organic film layer located in the light emitting area are different parts of the same film layer.

In one embodiment, the sixth inorganic layer 52 is located on the side of the second organic layer 51 close to the substrate 10. The second opening 501 includes a fourth sub-opening 521 disposed in the sixth inorganic layer 52 and a fifth sub-opening 511 disposed in the second organic layer 51. The orthographic projection of the fifth sub-opening 511 on the substrate 10 covers the orthographic projection of the fourth sub-opening 521 on the substrate 10. The orthographic projection of the fifth sub-opening 511 on the substrate 10 covers the orthographic projection of the fourth sub-opening 521 on the substrate 10, which means that the orthographic projection of the fifth sub-opening 511 on the substrate 10 coincides with the orthographic projection of the fourth sub-opening 521 on the substrate 10, or, the area of the orthographic projection of the fifth sub-opening 511 on the substrate 10 is larger than the area of the orthographic projection of the four sub-openings 521 on the substrate 10. In this way, the second organic layer 51 is not in direct contact with the second conductive portion 41, which can reduce the amount of water and oxygen intruded into the second conductive portion 41, and improve the reliability of the array substrate.

In one implementation, the orthographic projection of the fifth sub-opening 511 on the substrate 10 coincides with the orthographic projection of the fourth sub-opening 521 on the substrate 10. The orthographic projection of the fifth sub-opening 511 on the substrate 10 coincides with the orthographic projection of the fourth sub-opening 521 on the substrate 10, which means that the two orthographic projections are approximately coincident, including the complete coincidence of the two and there is a small gap between the edges of the two orthographic projections. In this way, only one mask can be used in the process of forming the second organic layer 51 and the sixth inorganic layer 52, which helps to reduce the manufacturing cost. Specifically, the formation process of the second organic layer 51 and the sixth inorganic layer 52 can be as follows.

First, an inorganic material film is formed, and the orthographic projection of the inorganic material film on the substrate covers the substrate.

Subsequently, an organic material film is formed on the inorganic material film, and the orthographic projection of the organic material film on the substrate covers the substrate.

Subsequently, using a mask as a shield, the organic material film is patterned to form a fifth sub-opening to obtain a second organic layer.

Subsequently, using the second organic layer as a shield, the inorganic material film is patterned to form a fourth sub-opening to obtain a sixth inorganic layer.

In one embodiment, the thickness of the second organic layer ranges from 2 um to 4 um. This arrangement can avoid an excessively large thickness of the second organic layer and resulting in a large offset in the film layer structure of the area where the bonding pin is located in the thickness direction of the substrate, which is not conducive to improving the reliability of the bonding between the bonding pin and the FPC. It can also avoid an excessively small thickness of the second organic layer and resulting in greater difficulty in the process. In some embodiments, the thickness of the second organic layer is, for example, 2 um, 2.5 um, 3 um, 3.5 um, 4 um, and the like.

In one embodiment, the thickness of the sixth inorganic layer ranges from 1500 angstroms to 3500 angstroms. In this way, it can avoid an excessively small thickness of the sixth inorganic layer and resulting in greater difficulty in the process, and can avoid an excessively large thickness of the sixth inorganic layer and resulting in an increased thickness of the array substrate and thus increased offset of the film layer structure in the area where the bonding pins are located in the thickness direction of the substrate which affects the reliability of the bonding between the bonding pins and FPC bonding.

In another embodiment, referring to FIG. 8, the second insulating layer 50 includes a sixth inorganic layer 52, and the array substrate further includes a third organic layer 80 located in the bonding area. The third organic layer 80 is located on the side of the sixth inorganic layer 52 away from the substrate 10. The third organic layer 80 is provided with fifth opening 81, and the fifth opening 81 is on the substrate 10. The orthographic projection of the fifth opening 81 covers the orthographic projections of the plurality of bonding pins 201 on the substrate 10. In this way, the arrangement of the third organic layer 80 will not increase the offset of the film layer structure in the area where the bonding pins are located in the thickness direction of the substrate, and will not affect the reliability of bonding between the bonding pin and the FPC.

In some embodiments, the orthographic projection of the fifth opening 81 provided in the third organic layer 80 on the substrate 10 coincides with the orthographic projection of the first opening 301 provided in the first insulating layer 30 on the substrate 10. In this way, the same mask can be used for the production process of the third organic layer and the production process of the first organic layer, which can reduce the number of masks used in the production process of the array substrate and help to reduce the production cost.

In some embodiments, the third organic layer 80 can be a single-layer film layer, or the third organic layer 80 includes a plurality of sub-organic layers and is formed by multiple coating processes. In some embodiments, the third organic layer 80 and the second organic film layer located in the light emitting area are different parts of the same film layer.

In some embodiments, the thickness of the third organic layer 80 ranges from 2 um to 4 um. In this way, it can be avoided that the thickness of the second organic layer is too small or too small, resulting in greater difficulty in the production process. In some embodiments, the thickness of the third organic layer 80 is, for example, 2 um, 2.5 um, 3 um, 3.5 um, 4 um, and the like.

When the display substrate is the embodiment shown in FIG. 4, the thicknesses of the first inorganic layer 32, the second inorganic layer 33 and the sixth inorganic layer 52 of the display substrate 100 can be different. For example, the thickness of the first inorganic layer 32 is 1500 angstroms, the thickness of the second inorganic layer 33 is 2400 angstroms, and the thickness of the sixth inorganic layer 52 is 3500 angstroms.

When the display substrate is the embodiment shown in FIG. 7 and FIG. 8, the thicknesses of the third inorganic layer 61, the fourth inorganic layer 62 and the sixth inorganic layer 52 of the display substrate 100 can be different. For example, the thickness of the third inorganic layer 61 is 1500 angstroms, the thickness of the fourth inorganic layer 62 is 2400 angstroms, and the thickness of the sixth inorganic layer 52 is 3500 angstroms. In one embodiment, the array substrate further includes a buffer layer 90 located between the substrate 10 and the first conductive layer 20. The material of the buffer layer 90 can be an inorganic material, such as silicon nitride or silicon oxide.

An array substrate includes, in the part of the bonding area, a second inorganic layer and a first organic layer are arranged between the first conductive portion and the second conductive portion, a second inorganic layer is arranged between the substrate and the first conductive portion or between the first conductive portion and the first organic layer, and the first organic layer, the first inorganic layer and the second inorganic layer respectively overlap with the first conductive portion in the thickness direction of the substrate; a second organic layer and a sixth inorganic layer are arranged above the second conductive portion, and the second organic layer and the sixth inorganic layer and the bonding pin do not overlap in the thickness direction of the substrate. The thickness of the first organic layer is 4 um, the thickness of the second organic layer is 3 um, the thickness of the first inorganic layer is 1500 angstroms, the thickness of the second inorganic layer is 2400 angstroms, and the thickness of the sixth inorganic layer is 3500 angstroms. The offset of the film layer structure in the area where the bonding pins are located in the thickness direction of the substrate is equal to the sum of the thicknesses of the first organic layer, the first inorganic layer and the second inorganic layer, which is equal to 4.39 um.

In the array substrate shown in FIG. 4, when each film layer of the array substrate has the same thickness as the corresponding film layer of the above-mentioned array substrate, the offset of the film layer structure in the area where the bonding pins are located in the thickness direction of the substrate is equal to the sum of the thicknesses of the second organic layer 51 and the sixth inorganic layer 52, which is equal to 3.35 um.

In the array substrate shown in FIG. 7, the thicknesses of the first organic layer, the second organic layer and the sixth inorganic layer of the array substrate are the same as the thicknesses of the corresponding film layers in the above-mentioned array substrate, and the thickness of the third inorganic layer is the same as the thickness of the first inorganic layer, the thickness of the fourth inorganic layer is the same as the thickness of the second inorganic layer of the above-mentioned array substrate, and the offset of the film layer structure in the area where the bonding pins are located in the thickness direction of the substrate is equal to the sum of the thicknesses of the third inorganic layer 61, the fourth inorganic layer 62, the sixth inorganic layer 52 and the second organic layer is equal to 3.74 um.

In the embodiment shown in FIG. 8, the thicknesses of the first organic layer, the second organic layer and the fifth inorganic layer of the array substrate are the same as the thicknesses of the corresponding film layers in the above-mentioned array substrate, and the thickness of the third inorganic layer is the same as the thickness of the first inorganic layer of the above-mentioned array substrate, the thickness of the fourth inorganic layer is the same as the thickness of the second inorganic layer of the above-mentioned array substrate, and the offset of the film layer structure in the area where the bonding pins are located in the thickness direction of the substrate is equal to the sum of the thicknesses of the third inorganic layer 61, the fourth inorganic layer 62 and the sixth inorganic layer 52, which is equal to 0.74 um. In the embodiment shown in FIG. 11, the thicknesses of the first organic layer, the second organic layer and the fifth inorganic layer of the array substrate are the same as the thicknesses of the corresponding film layers in the above-mentioned array substrate, and the thickness of the first sub-inorganic layer is the same as the thickness of the first inorganic layer of the above-mentioned array substrate, the thickness of the second sub-inorganic layer is the same as the thickness of the second inorganic layer of the above-mentioned array substrate, and the offset of the film layer structure in the area where the bonding pins are located in the thickness direction of the substrate is equal to the sum of the thicknesses of the first sub-inorganic layer 71, the second sub-inorganic layer 72 and the sixth inorganic layer 52, which is equal to 0.74 um.

It can be seen that the array substrate provided by the embodiment of the present application can reduce the offset of the film layer structure in the area where the bonding pins are located in the thickness direction of the substrate, and improve the reliability of bonding between the bonding pin and the FPC.

An embodiment of the present disclosure further provides a display device, which includes the array substrate described in any one of the above embodiments. Since the display device includes the above-mentioned array substrate, and thus has the same beneficial effects, details of which will not be repeated herein in the present disclosure.

The present disclosure does not specifically limit the application of display devices, which can be televisions, notebook computers, tablet computers, wearable display devices, mobile phones, vehicle-mounted displays, navigation, e-books, digital photo frames, advertising light boxes, and other products or components with flexible display capabilities.

It should be noted that, in the drawings, the sizes of layers and areas can be exaggerated for clarity of illustration. It will also be understood that when an element or layer is referred to as being "on" another element or layer, it can be directly on the other element or intervening layers can be present. In addition, it will be understood that when an element or layer is referred to as being "under" another element or layer, it can be directly under the other element, or more than one intervening layer or element can be present. In addition, it will also be understood that when a layer or element is referred to as being 'between' two layers or elements, it can be the only layer between the two layers or elements, or more than one intervening layer or element can also be present. Like reference numerals indicate like elements throughout.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. An array substrate, comprising:
a bonding area;
a substrate, a first conductive layer on the substrate, a first insulating layer on one side of the first conductive layer away from the substrate, and a second conductive layer on one side of the first insulating layer away from the substrate;
wherein the bonding area is provided with bonding pins, the bonding pin comprises a first conductive portion and a second conductive portion located on the side of the first conductive portion away from the substrate, the first conductive portion is located in the first conductive layer, the second conductive portion is located in the second conductive layer, and the first conductive portion is in direct contact with the second conductive portion;
the first insulating layer is provided with at least one first opening, and an orthographic projection of each of the at least one first opening on the substrate covers orthographic projections of a plurality of the bonding pins on the substrate;
wherein the array substrate is further provided with a second insulating layer on the side of the second conductive layer away from the substrate, and the second insulating layer is provided a plurality of second openings, an edge of an orthographic projection of each of the second openings on the substrate is located inside an edge of one of the second conductive portions on the substrate; and
wherein the array substrate further comprises a light emitting area located on one side of the bonding area, and a gap exists between an edge of an orthographic projection of the first opening on the substrate close to the light emitting area and an edge of the orthographic projections of the bonding pins on the substrate close to the light emitting area.

2. The array substrate according to claim 1, wherein a part of the first insulating layer located in the bonding area comprises a first organic layer.

3. The array substrate according to claim 2, wherein a part of the first insulating layer located in the bonding area further comprises an inorganic film layer.

4. The array substrate according to claim 3, wherein the inorganic film layer comprises a first inorganic layer on one side of the first organic layer away from the substrate, and the first opening comprises a first sub-opening disposed in the first organic layer and a second sub-opening disposed in the first inorganic layer, and an edge of an orthographic projection of the second sub-opening on the substrate is located inside an edge of an orthographic projection of the first sub-opening on the substrate.

5. The array substrate according to claim 4, wherein the inorganic film layer further comprises a second inorganic layer on the side of the first organic layer close to the substrate, and the first opening further comprises a third sub-opening disposed on the second inorganic layer; an orthographic projection of the third sub-opening on the substrate coincides with an orthographic projection of the second sub-opening on the substrate.

6. The array substrate according to claim 2, wherein the second conductive portion covers a side part and a top part of the first conductive portion.

7. The array substrate according to claim 2, wherein the array substrate further comprises a third inorganic layer located in the bonding area, the third inorganic layer is located between the first organic layer and the second conductive portion; the third inorganic layer is provided with a plurality of third openings, and an edge of an orthographic projection of each of the third openings on the substrate is located inside an edge of an orthographic projection of one of the first conductive portions on the substrate.

8. The array substrate according to claim 2, wherein the array substrate further comprises a fourth inorganic layer located in the bonding area, the fourth inorganic layer is located between the first conductive portion and the substrates or between a first conductive structure and the first organic layer, the fourth inorganic layer is provided with a plurality of fourth openings; and an edge of an orthographic projection of each of the fourth openings on the substrate is located inside an edge of an orthographic projection of one of the first conductive portions on the substrate.

9. The array substrate according to claim 2, wherein the array substrate further comprises a fifth inorganic layer located in the bonding area, and the fifth inorganic layer is located between the first conductive portion and the second conductive portions; the fifth inorganic layer is provided with a plurality of via holes, orthographic projections of the plurality of via holes on the substrate are located inside an orthographic projection of the first conductive portion on the substrate, and the second conductive portion is connected to the first conductive portion through the plurality of via holes.

10. The array substrate according to claim 1, wherein a part of the second insulating layer located in the bonding area comprises a sixth inorganic layer.

11. The array substrate according to claim 10, wherein the second insulating layer further comprises a second organic layer, and a size of the second organic layer in the thickness direction of the substrate is smaller than or equal to a sum of sizes of the first conductive portion and the second conductive portion in the thickness direction of the substrate.

12. The array substrate according to claim 11, wherein the sixth inorganic layer is located on one side of the second organic layer close to the substrate; the second sub-opening comprises a fourth sub-opening disposed in the six inorganic layer and a fifth sub-opening disposed in the second organic layer, an orthographic projection of the fifth sub-opening on the substrate covers an orthographic projection of the fourth sub-opening on the substrate.

13. The array substrate according to claim 12, wherein the orthographic projection of the fifth sub-opening on the substrate coincides with the orthographic projection of the fourth sub-opening on the substrate.

14. The array substrate according to claim 10, wherein the array substrate further comprises a third organic layer located in the bonding area, the third organic layer is located on one side of the sixth inorganic layer away from the substrate, the third organic layer is provided with a fifth opening, and an orthographic projection of the fifth opening on the substrate covers the orthographic projections of the plurality of bonding pins on the substrate.

15. The array substrate according to claim 1, wherein the first insulating layer comprises a first organic layer located in the bonding area and a fourth organic layer located in the light emitting area, the first organic layer and the fourth organic layer are disposed in the same layer, the first organic layer has the same thickness as that of the fourth organic layer.

16. A display device, comprising the array substrate according to claim 1.

17. The array substrate according to claim 3, wherein the second conductive portion covers a side part and a top part of the first conductive portion.

18. The array substrate according to claim 4, wherein the second conductive portion covers a side part and a top part of the first conductive portion.

* * * * *